United States Patent [19]

Takeuchi

[11] Patent Number: 5,497,030
[45] Date of Patent: Mar. 5, 1996

[54] LEAD FRAME AND RESIN-MOLDED-TYPE SEMICONDUCTOR DEVICE

[75] Inventor: Yukiharu Takeuchi, Nagano, Japan

[73] Assignee: Shinko Electric Industries Co., Ltd., Nagano, Japan

[21] Appl. No.: 260,322

[22] Filed: Jun. 15, 1994

[30] Foreign Application Priority Data

Jun. 24, 1993 [JP] Japan .................................. 5-153350

[51] Int. Cl.⁶ .................................................. H01L 29/52
[52] U.S. Cl. ........................... 257/676; 257/668; 257/666
[58] Field of Search .................................. 257/666, 668, 257/676, 672

[56] References Cited

U.S. PATENT DOCUMENTS

| | | | |
|---|---|---|---|
| 4,680,613 | 7/1987 | Daniels et al. | 257/659 |
| 4,771,330 | 9/1988 | Long | 257/668 |
| 4,843,188 | 6/1989 | Patterson et al. | 257/668 |
| 5,025,114 | 6/1991 | Braden | 257/676 |
| 5,057,805 | 10/1991 | Kadowaki | 257/666 |
| 5,212,405 | 5/1993 | Oigawa | 257/666 |
| 5,235,207 | 8/1993 | Ohi et al. | 257/672 |
| 5,283,717 | 2/1994 | Hundt | 257/666 |
| 5,338,971 | 8/1994 | Casati et al. | 257/666 |
| 5,347,429 | 9/1994 | Kohno et al. | 257/666 |

FOREIGN PATENT DOCUMENTS

| | | | |
|---|---|---|---|
| 0141946 | 9/1982 | Japan | 257/666 |
| 3-102747 | 10/1991 | Japan . | |
| 4-000751 | 1/1992 | Japan . | |
| 0072750 | 3/1992 | Japan | 257/666 |

*Primary Examiner*—Rolf Hille
*Assistant Examiner*—Alexander Oscar Williams
*Attorney, Agent, or Firm*—Staas & Halsey

[57] ABSTRACT

A lead frame includes a chip mount board, on which a semiconductor chip is to be mounted, and a lead frame body. The chip mount board is made of an electrically insulated substrate and conductive patterns are formed on said insulated substrate. The lead frame body includes a plurality of leads arranged side by side to constitute a co-planar structure and used as signal leads and as ground or power supply leads arranged at the sides of said signal lead. The signal lead has a predetermined width and predetermined distances to the adjacent ground or power supply leads, and the width and distances are determined in such a manner that the signal lead has a desired characteristic impedance. A semiconductor chip is mounted on said chip mount board, electrically connected the conductive patterns on the chip mount board and, hermetically sealed with resin.

10 Claims, 2 Drawing Sheets

MOLDED LINE

LEAD FRAME AND RESIN-MOLDED-TYPE SEMICONDUCTOR DEVICE

BACKGROUND OF THE INVENTION

1. Field of the Invention

The present invention relates to a lead frame and a resin-molded-type semiconductor device using the same.

2. Description of the Related Art

A resin-molded-type semiconductor has been conventionally used mainly for low-frequency purposes. On the other hand, for high-frequency purposes a ceramic package has been generally and widely used. When a high frequency signal is transmitted, since it is difficult to obtain a desired characteristic impedance in a lead frame, the wave shapes of such high-frequency signals may easily be deformed. Therefore, for a high-frequency semiconductor device, a ceramic package can appropriately be used, because the ceramic package is able to be adapted to the desired characteristic impedance. In addition, a ceramic package having multi-layered line patterns can be formed and, therefore, the characteristic impedance thereof can appropriately be matched by suitably designing the distance between adjacent layers or line patterns or the thickness of respective layers.

On the other hand, a lead frame for resin-molded-type semiconductors has not been designed in such a manner that the width of leads or the distance between the adjacent leads are in conformity with those values to obtain a desired characteristic impedance. Therefore, a deflection of a signal may occur due to the miss-matching of the characteristic impedance and, therefore, decay of signal or deformation of the signal wave shape may easily occur. Thus, in general, a conventional lead frame is inappropriate for a high-frequency semiconductor device.

SUMMARY OF THE INVENTION

An object of the present invention is to provide a lead frame for a resin-molded-type semiconductor device, in which a plurality of leads including signal leads and ground or power supply leads arranged side by side to constitute a co-planar structure and the characteristic impedance of the signal leads can be adjusted in such a manner that a satisfactory performance can be obtained in the high-frequency region.

Another object of the present invention is to provide a resin-molded-type semiconductor device using a lead frame having a satisfactory performance in the high-frequency region, as mentioned above.

According to the present invention, there is provided lead frame for resin-molded-type semiconductor device, said lead frame comprising: a plurality of leads arranged side by side to, constitute a co-planar structure, said plurality of leads comprising; at least one first lead to be used as a signal lead and at least two second leads to be used as ground or power supply leads arranged at the respective sides of said signal lead; and each of said signal leads having a predetermined lead width and predetermined distances to the adjacent ground or power supply leads, said width and said distances determined in such a manner that said signal lead has a desired characteristic impedance.

According to another aspect of the present invention, there is provided a resin-molded-type semiconductor device comprising;

a lead frame comprising; a die-pad and a plurality of leads arranged side by side to constitute a co-planar structure and having respective inner lead portions, said plurality of leads comprising: at least one first lead to be used as a signal lead and at least two second leads to be used as ground or power supply leads arranged at the respective sides of said signal lead; and each of said signal lead having a predetermined lead width and predetermined distances to the adjacent ground or power supply leads, said width and said distances determined in such a manner that said signal lead has a desired characteristic impedance;

a semiconductor chip mounted on said die-pad of said lead frame;

connecting means for electrically connecting said semiconductor chip to said plurality of leads; and a hermetically-sealed resin molding containing at least said semiconductor chip, said die-pad, said inner lead portions and said connecting means.

Thus, in the present invention, a lead frame or a resin-molded-type semiconductor device having a co-planar structure and also having a desired characteristic impedance can be obtained.

According to still another aspect of the present invention, there is provided a lead frame for a resin-molded-type semiconductor device, said lead frame comprising; a chip mount board on which a semiconductor chip is to be mounted, said chip mount board comprising an electrically insulated substrate and conductive patterns formed on said insulated substrate; and a lead frame body comprising: a plurality of leads arranged side by side to constitute a co-planar structure and having respective inner leads electrically connected to said respective conductive patterns on the chip mount board to be electrically connected to said semiconductor chip, said plurality of leads comprising: at least one first lead to be used as a signal lead and at least two second leads to be used as ground or power supply leads arranged at the respective sides of said signal lead; and each of said signal leads having a predetermined lead width and predetermined distances to the adjacent ground or power supply leads, said width and said distances being determined in such a manner that said signal lead has a desired characteristic impedance.

According to further aspect of the present invention, there is provided a resin-molded-type semiconductor device comprising:

a chip mount board comprising an electrically insulated substrate and conductive patterns formed on said insulated substrate; and a lead frame comprising: a plurality of leads arranged side by side to constitute a co-planar structure and having respective inner lead portions electrically connected to said respective conductive patterns on the chip mount board, said plurality of leads comprising: at least one first lead to be used as a signal lead and at least two second leads to be used as ground or power supply leads arranged at the respective sides of said signal lead; and each of said signal leads having a predetermined lead width and predetermined distances to the adjacent ground or power supply leads, said width and said distances being determined in such a manner that said signal lead has a desired characteristic impedance.

a semiconductor chip mounted on said chip mount board;

connecting means for electrically connecting said semiconductor chip to said conductive patterns formed on chip mount board; and a hermetically-sealed resin molding containing at least said semiconductor chip, said chip mount board, said connecting means and said inner lead portions.

Therefore, according to the present invention, a lead frame and a resin-molded-type semiconductor device using the same can be obtained in which the characteristic impedance can be adjusted and fine patterns can be obtained having high performance in the high-frequency region.

DETAILED DESCRIPTION OF THE EMBODIMENTS

Figure 1:
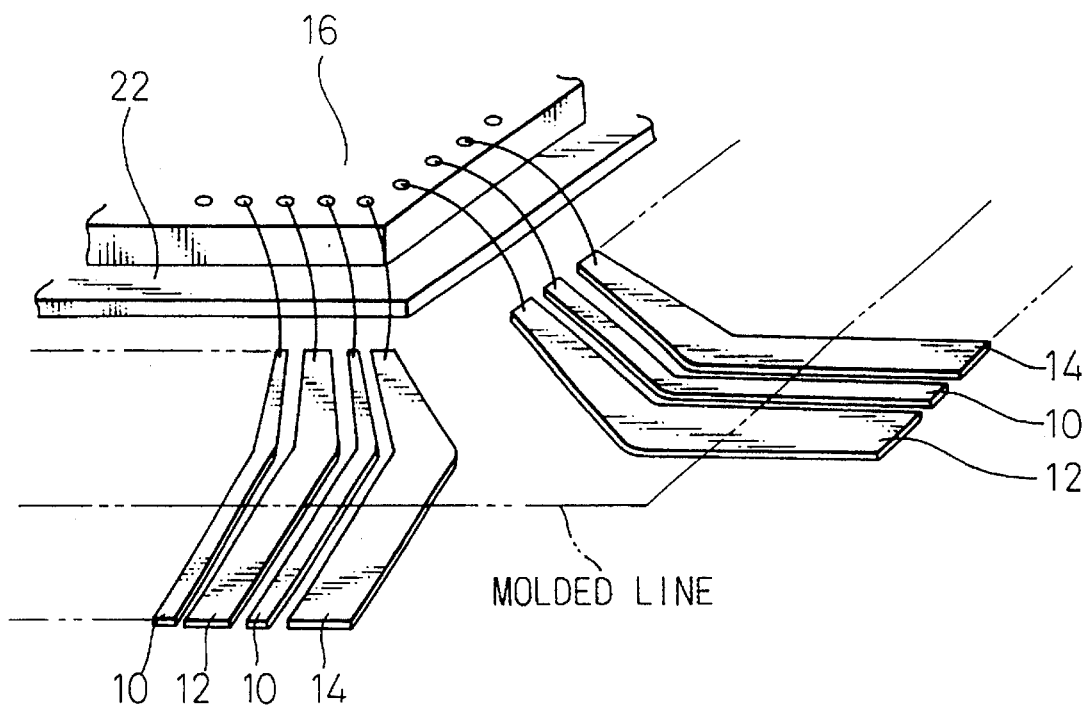
FIG. 1 is a perspective view showing a first embodiment of a lead frame according to the present invention.

The present invention will now be explained in detail with reference to the embodiments shown in the drawings. In FIG. 1, a first embodiment of a lead frame of this invention is illustrated. In this lead frame, in order to adapt the characteristic impedance of signal lines, in this invention, ground leads or power supply leads are arranged at the respective sides of the signal leads to constitute a co-planar structure. That is to say, two ground leads or two power supply leads are arranged at the respective sides of a signal lead, or a ground lead and a power supply lead are arranged at the respective sides of a signal lead, respectively, in a single common plane.

The lead frame shown in FIG. 1 comprises signal lines 10, ground leads 12 and power supply leads 14, which are arranged in a common plane. In the illustrated first embodiment, a ground lead 12 and a power supply lead 14 are arranged at the respective sides of each signal line 10. However, two ground leads 12 or two power supply leads 14 may be arranged at the respective sides of the signal lead 10. In any cases, at the respective sides of a signal lead there are ground leads and/or power supply leads in a co-planar structure.

In a lead frame having such a co-planar structure, in order to adjust the characteristic impedance of the signal line 10 to a desired value, the width of the signal lead 10 and the distance between the signal lead 10 and the adjacent leads consisting of a ground lead and/or power supply lead must be adjusted. Accordingly, such widths and distances are determined in consideration of the dielectric constant of the molding resin to obtain a matching characteristic impedance.

In an example of the lead frame, in which the width of the signal lead 10 was 0.2 mm, the distance between the signal lead and adjacent leads was about 0.1 mm and a molding resin having a dielectric constant $\epsilon=3.8$ was used for hermetical sealing, a characteristic impedance of 50 Ω was obtained.

Figure 2:
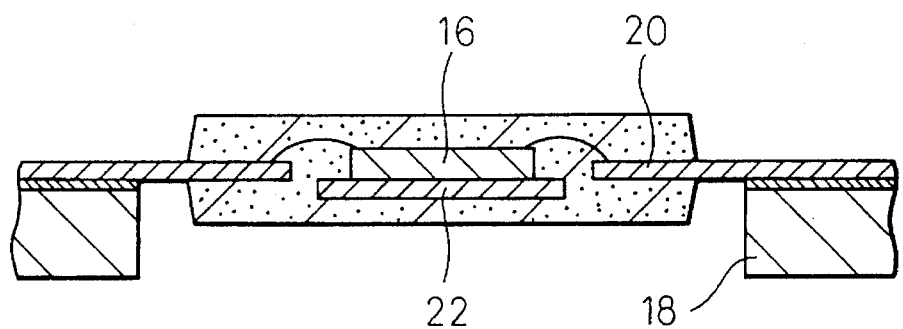
FIG. 2 is a cross-sectional view showing a semiconductor device using a lead frame of the first embodiment.

FIG. 2 shows a semiconductor device using a lead frame as shown in FIG. 1, in which the reference numeral 20 denotes inner leads of the lead frame and 22 denotes a die-pad. A semiconductor chip 16 is mounted on the die-pad 22 of the lead frame. Then, the semiconductor chip 16 is connected to the inner leads portions 20 of the lead frame by means of bonding wires. Then, the semiconductor chip 16, the die-pad 22, the bonding wires and the inner lead portions 20 are hermetically sealed in resin, in a conventionally known method. Then, a semiconductor device is mounted on a mounting board 18. The semiconductor chip 16 is electrically connected to the inner leads 20 by bonding wires. The outer leads of the lead frame are electrically connected to the line patterns formed on the mounting board 18.

According to the semiconductor device of this embodiment, the characteristic impedance of the signal leads is adjusted in a co-planar line structure and, therefore, the lead frame of this embodiment can be used even in a high-frequency region where a conventional-type lead frame cannot be used.

The second embodiment of a lead frame and a semiconductor device of this invention will now be described with reference to FIGS. 3 and 4.

Figure 3:
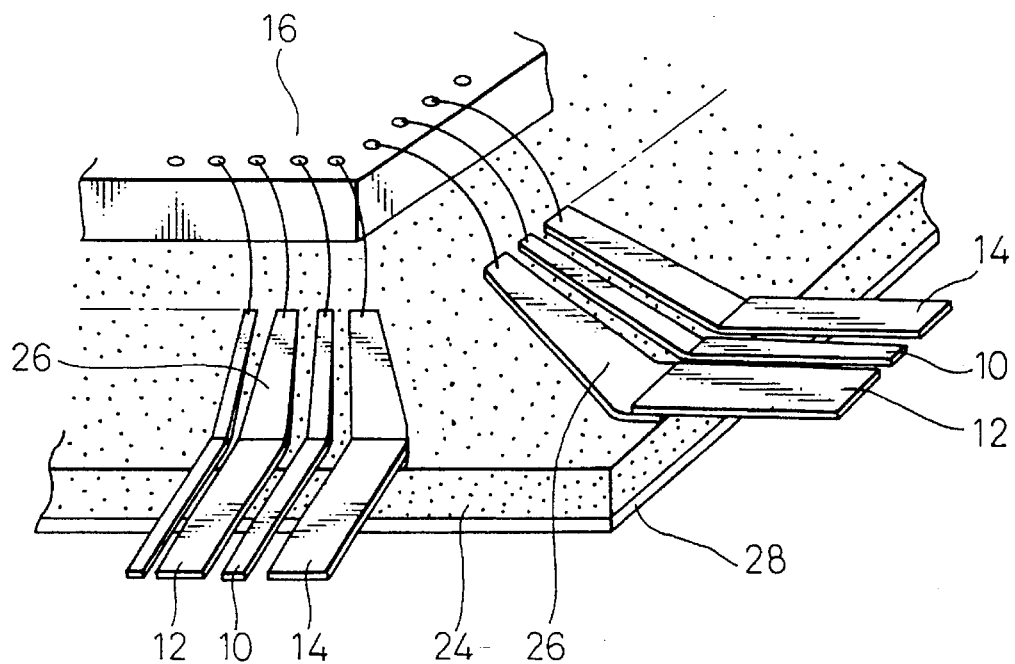
FIG. 3 is a perspective view showing a second embodiment of a lead frame according to the present invention.

The semiconductor device of the second embodiment comprises, as shown in FIG. 3, a semiconductor chip 16 mounted on an electrically insulating ceramic or resin board 24 which is a different part from the lead frame including a plurality of leads, i.e., signal leads and ground or power supply leads. On the upper surface of the insulation board 24 are formed conductive patterns 26 by which the semiconductor chip 16 is electrically connected to the inner lead portions of the signal leads 10, the ground leads 12 and the power supply leads 14 of the lead frame.

As shown in FIG. 3, the conductive patterns 26 are arranged in such a manner that the respective outer ends thereof are in conformity with the signal lines 10, the ground leads 12 and the power supply leads 14. Also, the conductive patterns 26 extend from the outer periphery of the insulating board 24 to the vicinity of the periphery of the semiconductor chip 16.

In the same manner as the previous embodiment, the width of the signal lead 10 and the distance between the signal lead 10 the adjacent leads 12 or 14 are determined in order to adjust the characteristic impedance of signal leads 10 to a desired value. Also, as illustrated in FIG. 3, a ground leads 12 and a power supply leads 14 are arranged adjacent to and at the sides of the signal line 10.

In this embodiment, in order to adjust the characteristic impedance of the conductive patterns 26 formed on the insulating board 24 in addition to the signal leads 10, a conductive layer 28 is formed on the lower surface of the board 24 for the ground level. The conductive layer 28 may be connected to the ground level, i.e., the ground lead 12, by means of via hole or metal plated through hole as shown at 30.

In addition, in this embodiment, the thickness of the board 24 is also suitably determined and the material thereof is also suitably selected in such a manner that the characteristic impedance approaches a desired value.

For example, in a lead frame having a ground layer 28 formed on the lower surface of the board 24, if the thickness of the board 24 was 0.15 mm, the relative di-electric constant of the insulation material of board 24 was 3.6, the width of signal pattern was 0.1 mm, and the distance between the signal lead and adjacent leads was 0.10 mm, a characteristic impedance of 52 Ω was obtained. In this case, if the width of signal pattern was 0.05 mm and the distance between the signal lead and adjacent leads was 0.05 mm, a characteristic impedance of 47 Ω was obtained.

In general, if the thickness of the board 24 was smaller, the width of a signal pattern was larger, or the distance between the signal lead and adjacent leads was smaller, the characteristic impedance would become smaller.

The insulating material of board 24 can be suitably selected and the distance between the conductive pattern 26 and conductive layer 28 can also be suitably selected by adopting a multi-layer structured board 24. Therefore, according to the semiconductor device of this embodiment, the characteristic impedance can be adapted to a desired value in the same manner as a conventionally known ceramic packages.

In a semiconductor device of this embodiment, the conductive pattern 26 can be made so fine that the conductive pattern 26 can be extended to the vicinity of the semiconductor chip 16 and the leads, such as the signal leads 10 and the ground leads 12 or the like, can be connected to the outer ends of the conductive patterns 26. Therefore, the manufacturing of the semiconductor devices can easily be carried out.

Figure 4:
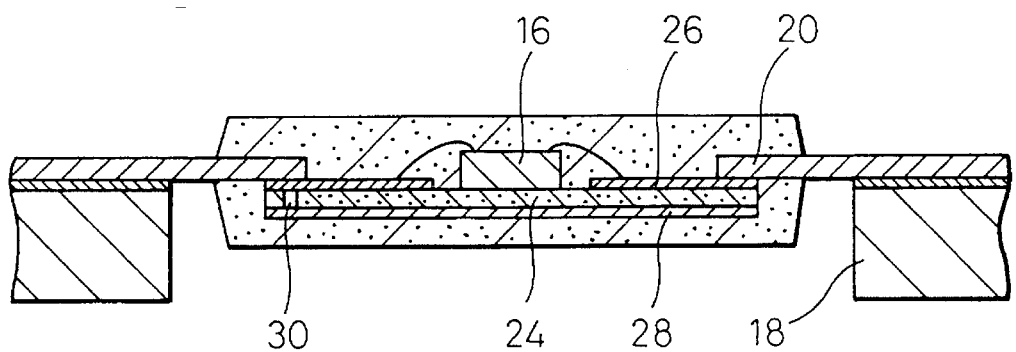
FIG. 4 is a cross-sectional view showing a semiconductor device using a lead frame of the second embodiment.

FIG. 4 shows a semiconductor device in which a semiconductor chip 16 is mounted on the lead frame of the above-mentioned embodiment and molded in resin, and then such a semiconductor device is mounted on the mount board 18.

According to the semiconductor device of this embodiment, the characteristic impedance for the lead frame portion outside of the board 24 can be matched within the mold resin, and the characteristic impedance for the conductive patterns 26 can be matched within the board 24. A resin-molded-type semiconductor device having a suitably matched characteristic impedance can thus be obtained.

It is impossible to match the characteristic impedance by adjusting the lead width or the distance between adjacent leads for the leads exposed outside from the mold resin and, therefore, it is preferable that the outer leads of the semiconductor device exposed outside the mold resin are as short as possible, so that the outer leads are electrically connected at positions as close as possible to the line patterns of the mount board 18.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

I claim:

1. A resin-molded-type semiconductor device comprising:
   a lead frame comprising:
   a die-pad and
   a plurality of leads arranged side by side to constitute a co-planar structure and having respective inner lead portions, said plurality of leads comprising:
   at least one first lead to be used as a signal lead and at least two second leads to be used as ground or power supply leads arranged at the sides of said signal lead, said second leads are not integrally formed with the die-pad, but individually formed to be separate therefrom;
   each said signal lead having a predetermined lead and predetermined distances to the adjacent ground or power supply leads, said width and said distances being determined in such a manner that said signal lead has a desired characteristic impedance;
   a semiconductor chip mounted on said die-pad of said lead frame;
   connecting means for electrically connecting said semiconductor chip to said plurality of leads; and
   a hermetically-sealed resin molding containing at least said semiconductor chip, said die-pad, said inner lead portions and said connecting means.

2. A lead frame for a resin-molded-type semiconductor device, said lead frame comprising:
   a chip mount board on which a semiconductor chip is to be mounted, said chip mount board comprising an electrically insulated substrate and conductive patterns formed on said insulated substrate; and
   a lead frame body including a plurality of leads arranged side by side to constitute a co-planar structure and having inner leads electrically connected to said conductive patterns on the chip mount board to be electrically connected to said semiconductor chip, said plurality of leads comprising:
   at least one first lead to be used as a signal lead and at least two second leads to be used as ground or power supply leads arranged at the sides of said signal lead wherein said second leads are not integrally formed with the die-pad, but individually formed to be separate therefrom, and
   each of said signal leads having a predetermined lead width and predetermined distances to the adjacent ground or supply leads, said width and said distances being determined in such a manner that said signal leads have a desired characteristic impedance.

3. A lead frame as set forth in claim 2, wherein at least one of said second leads is a ground lead, said chip mount board has a first surface on which said conductive patterns are formed and an opposite, second surface on which a conductive layer is formed, and said conductive layer is electrically connected to said ground lead.

4. A lead frame as set forth in claim 2, wherein each of said adjacent ground or power supply leads has a width which is different from the width of said signal lead.

5. A lead frame as set forth in claim 4, wherein the width of each said adjacent ground or power supply lead is larger than the width of the signal lead.

6. A resin-molded-type semiconductor device comprising:
   a chip mount board comprising an electrically insulated substrate and conductive patterns formed on said insulation substrate; and
   a lead frame comprising:
   a plurality of leads arranged side by side to constitute a co-planar structure and having inner lead portions electrically connected to said conductive patterns on the chip mount board, said plurality of leads comprising:
   at least one first lead to be used as a signal lead and at least two second leads to be used as ground on power supply leads arranged at the sides of said signal lead, said second leads are not integrally formed with the die-pad, but individually formed to be separate therefrom;
   each of said signal lead having a predetermined lead width and predetermined distances to the adjacent ground or power supply leads, said width and said distances being determined in such a manner that said signal lead has a desired characteristic impedance;
   a semiconductor chip mounted on said chip mount board;
   connecting means for electrically connecting said semiconductor chip to said conductive patterns formed on chip mount board; and a hermetically-sealed resin molding containing at least said semiconductor chip, said chip mount board, said connecting means and said inner lead portion.

7. The lead frame as set forth in claim 1, wherein each of said adjacent ground or power supply leads has a width which is different from the width of said signal lead.

8. The lead frame as set forth in claim 7, wherein the width of each of said adjacent ground or power supply leads is larger than the width of the signal lead.

9. The lead frame as set forth in claim 6, wherein each of said adjacent ground or power supply leads has a width which is different from the width of said signal lead.

10. The lead frame as set forth in claim 9, wherein the width of each of said adjacent ground or power supply leads is larger than the width of the signal lead.

* * * * *